1. USOO9304176B2

United States Patent
Koyama et al.

(10) Patent No.: US 9,304,176 B2
(45) Date of Patent: Apr. 5, 2016

(54) THIN-FILM MAGNETIC SENSOR INCLUDING A GMR FILM AND METHOD FOR MANUFACTURING THE SAME

(75) Inventors: Shigenobu Koyama, Nagoya (JP); Kaori Imaeda, Nagoya (JP)

(73) Assignee: Daido Tokushuko Kabushiki Kaisha, Aichi (JP)

( * ) Notice: Subject to any disclaimer, the term of this patent is extended or adjusted under 35 U.S.C. 154(b) by 374 days.

(21) Appl. No.: 12/979,533

(22) Filed: Dec. 28, 2010

(65) Prior Publication Data
US 2011/0175606 A1 Jul. 21, 2011

(30) Foreign Application Priority Data
Jan. 21, 2010 (JP) .................. 2010-011433

(51) Int. Cl.
*G01R 33/09* (2006.01)
*G11B 5/127* (2006.01)
(Continued)

(52) U.S. Cl.
CPC ............. *G01R 33/093* (2013.01); *B82Y 25/00* (2013.01); *H01L 43/08* (2013.01); *H01L 43/12* (2013.01)

(58) Field of Classification Search
CPC ...... G01R 33/06; G01R 33/09; G01R 33/091; G01R 33/093; G01R 33/095; G01R 33/096; G01R 33/098; H01L 43/00; H01L 43/08; H01L 43/12; B82Y 25/00; G11B 5/127; G11B 5/33; G11B 5/37; G11B 5/39
USPC ........................................ 324/252
See application file for complete search history.

(56) References Cited

U.S. PATENT DOCUMENTS 3,260,932 A * 7/1966 Weiss et al. .................. 324/252
6,324,036 B1 * 11/2001 Dill et al. ...................... 360/320
(Continued)

FOREIGN PATENT DOCUMENTS

CN 1394284 A 1/2003
CN 101351902 A 1/2009
(Continued)

OTHER PUBLICATIONS

Machine English translation of the detailed description of JP 2004-354181, obtained from the Japanese Patent Office Website, obtained on Sep. 30, 2015.*
(Continued)

*Primary Examiner* — Jay Patidar
*Assistant Examiner* — David M. Schindler
(74) *Attorney, Agent, or Firm* — Bacon & Thomas, PLLC

(57) ABSTRACT

The present invention provides a thin-film magnetic sensor including: a giant magnetoresistive film having a giant magnetoresistive effect, and thin-film yokes each composed of a soft magnetic material and electrically connected to both ends of the giant magnetoresistive film, in which each of the thin-film yokes includes an outer yoke which is composed of a first soft magnetic material and is provided outward with respect to the giant magnetoresistive film and an inner yoke which is composed of a second soft magnetic material and is provided between the giant magnetoresistive film and the outer yoke; the first soft magnetic material is composed of a crystalline or microcrystalline soft magnetic material; the thin-film magnetic sensor is obtained by (1) forming the each outer yoke, the giant magnetoresistive film and the each inner yoke in this order, and (2) performing a heat treatment for improving soft magnetic characteristics of the each outer yoke before forming the giant magnetoresistive film; and a length $L_2$ of the each inner yoke satisfies the following equation (a) and equation (b):

$$L_2/t_1 \geq 1 \tag{a}$$

$$L_2 \times 100/(L_1+L_2) \leq 50 \tag{b}$$

where $t_1$ is a thickness of the each outer yoke, and $L_1$ is a length of the each outer yoke.

2 Claims, 5 Drawing Sheets

(51) Int. Cl.
  *B82Y 25/00* (2011.01)
  *H01L 43/08* (2006.01)
  *H01L 43/12* (2006.01)

(56) References Cited

U.S. PATENT DOCUMENTS

| | | | |
|---|---|---|---|
| 7,112,957 B2 * | 9/2006 | Bicking | 324/207.25 |
| 7,170,287 B2 | 1/2007 | Kobayashi et al. | |
| 2003/0042902 A1 * | 3/2003 | Kobayashi et al. | 324/252 |
| 2005/0280411 A1 | 12/2005 | Bicking | |
| 2009/0212770 A1 * | 8/2009 | Koyama | 324/249 |

FOREIGN PATENT DOCUMENTS

| | | |
|---|---|---|
| CN | 101520493 A | 9/2009 |
| CN | 101601148 A | 12/2009 |
| JP | 2003-078187 | 3/2003 |
| JP | 2004354181 | 12/2004 |
| JP | 2006-351563 | 12/2006 |
| JP | 2009-229380 | 10/2009 |

OTHER PUBLICATIONS

Chinese Office Action issued on Jun. 5, 2014 in corresponding Chinese Application No. 201110025835.9.

* cited by examiner

THIN-FILM MAGNETIC SENSOR INCLUDING A GMR FILM AND METHOD FOR MANUFACTURING THE SAME

FIELD OF THE INVENTION

The present invention relates to a thin-film magnetic sensor and a method for manufacturing the same, and more particularly to a thin-film magnetic sensor suitable for detection of rotation information of automobile axles, rotary encoders, industrial gears and the like, detection of position-speed information of stroke positions of hydraulic cylinders/pneumatic cylinders, slides of machine-tools and the like, detection of current information of arc current of industrial welding robots and the like, geomagnetic azimuth compasses and the like, and a method for producing the same.

BACKGROUND OF THE INVENTION

A magnetic sensor is an electronic device for converting a detected amount such as electromagnetic force (for example, current, voltage, electric power, magnetic field or magnetic flux), dynamic quantity (for example, position, speed, acceleration, displacement, distance, tension, pressure, torque, temperature or humidity) or biochemical quantity, into voltage through a magnetic field. The magnetic sensors are classified into a Hall sensor, an anisotropic magnetoresistive sensor (herein after may also be referred as AMR sensor), a giant magnetoresistive sensor (herein after may also be referred as GMR sensor) and the like, depending on a method for detecting the magnetic field.

Among these sensors, GMR sensors are advantageous in that:

(1) GMR sensors have an extremely large maximum value in the rate of change in electrical resistivity (that is to say, (MR ratio=$\Delta\rho/\rho_0$ ($\Delta\rho=\rho_H-\rho_0$, wherein $\rho_H$ is electrical resistivity where an external magnetic field is H, and $\rho_0$ is electrical resistivity where an external magnetic field is 0) in comparison with AMR sensors;

(2) GMR sensors have a small temperature change in resistance value in comparison with the Hall sensor; and (3) GMR sensors are suitable for miniaturization, because the materials having a giant magnetoresistive effect (herein after may also be referred as GMR effect) are a thin-film material. Accordingly, GMR sensors have been expected to be applied as a high-sensitivity micromagnetic sensor which is used in computers, electric power equipment, automobiles, home domestic equipment, portable equipment and the like.

The materials known to show the GMR effect include a metal artificial lattice composed of a multilayer film having a ferromagnetic layer (for example, a permalloy layer) and a non-magnetic layer (for example, a Cu, Ag or Au layer) or a multilayer film with a four layer structure (so-called "spin valve") having an antiferromagnetic layer, a ferromagnetic layer (a fixed layer), a non-magnetic layer and a ferromagnetic layer (a free layer); a metal-metal-based nano-granular material including nanometer-sized fine particles composed of a ferromagnetic metal (for example, permalloy) and a grain boundary phase composed of a non-magnetic metal (for example, Cu, Ag or Au); a tunnel junction film causing a MR (magnetoresistive) effect by a spin-dependent tunneling effect; and a metal-insulator-based nano-granular material including nanometer-sized fine particles composed of a ferromagnetic metal alloy and a grain boundary phase composed of a non-magnetic insulating material.

Among these materials, multilayer films represented by the spin valve are generally have a feature that they are high in sensitivity in a low magnetic field. However, multilayer films are poor in stability and yield, and have a limit for restricting manufacturing cost, because it is necessary to laminate thin films composed of various materials with a high degree of accuracy. Accordingly, multilayer films of this kind are exclusively used only for high-value added devices (for example, a magnetic head for a hard disk), and are considered difficult to be applied to magnetic sensors which are forced to make competition in price with AMR sensors or hall sensors having a low unit price. Further, since diffusion tends to occur between layers of the multilayer film and the GMR effect tends to disappear, the multilayer films have a significant drawback of poor heat resistance.

On the other hand, nano-granular materials are generally easily manufactured and have good reproducibility. Accordingly, when the nano-granular materials are applied to the magnetic sensors, the cost of the magnetic sensors can be decreased. In particular, the metal-insulator-based nano-granular materials are advantageous in that:

(1) the metal-insulator-based nano-granular materials show a high MR ratio exceeding 10% at room temperature, when a composition thereof is optimized;

(2) the metal-insulator-based nano-granular materials have an outstandingly high electrical resistivity $\rho$, so that micro-miniaturization and low power consumption of the magnetic sensor are realizable at the same time; and (3) the metal-insulator based nano-granular materials can be used even under a high temperature circumstance unlike the spin valve film containing an antiferromagnetic film which is poor in heat resistance. However, the metal-insulator-based nano-granular materials have a problem that magnetic field sensitivity is extremely small in a low magnetic field. Accordingly, in such a case, yokes composed of a soft magnetic material are disposed on both ends of a giant magnetoresistive film (herein after may also be referred as GMR film) to increase the magnetic field sensitivity of the GMR film.

Various proposals have hitherto been made for a thin-film magnetic sensor in which the yokes composed of the soft magnetic material are disposed on both ends of the GMR film and a method for manufacturing the same.

For example, JP-A-2004-363157 discloses a method for manufacturing a thin-film magnetic sensor including: (1) forming a protrusion on a surface of a substrate, (2) forming thin-film yokes on both ends of the protrusion, and (3) forming a GMR film on a leading end surface of the protrusion and surfaces of the thin-film yokes adjacent thereto. This document describes that (a) the GMR film having a uniform thickness can be formed over the length of a gap and that (b) electric and magnetic characteristics of the thin-film magnetic sensor is stabilized, owing to such a method.

Further, JP-A-2006-351563 discloses a thin-film magnetic sensor in which a barrier layer is formed between a GMR film and a substrate.

This document describes that when the barrier layer is provided between the GMR film and the substrate, annealing-derived changes in the rate of change in electric resistance R and the rate of change in magnetic resistance of the GMR film after annealing become approximately equivalent to those in the case of the GMR film alone.

Furthermore, JP-A-2003-78187 discloses a thin-film magnetic sensor in which soft magnetic thin films are formed on both ends of a GMR film, and hard magnetic thin films are further formed on undersurfaces of the soft magnetic thin films.

This document describes that when a bias magnetic field is applied to the soft magnetic thin films by using the hard magnetic thin films, the magnitude of an external magnetic field and polarity can be detected at the same time

SUMMARY OF THE INVENTION

In a magnetic sensor in which thin-film yokes are disposed on both ends of a GMR film, in order to obtain good electric and magnetic contact between the GMR film and the thin-film yokes, it is preferred to first form the GMR film and then form the thin-film yokes. Further, in the magnetic sensor of this kind, the sensitivity of the sensor is mainly determined by the shape and magnetic characteristics of the thin-film yokes. Soft magnetic materials used for the thin-film yokes are roughly classified into an amorphous material and a crystalline or microcrystalline material.

Among these materials, the amorphous material is characterized by that the necessary performance can be obtained only by forming the film at room temperature and that no heat treatment for improving soft magnetic characteristics is required. However, when the magnetic sensor is mounted, it is exposed to high temperature (usually, about 250° C.) during solder reflow and the like in many cases. Further, the magnetic sensor is sometimes used at a temperature of about 100° C. for a long period of time depending on the use thereof. Accordingly, the magnetic sensor using the amorphous material has a problem that crystallization of the amorphous material proceeds by the heating during production or use, whereby hysteresis is increased.

On the other hand, when the crystalline or microcrystalline material is used as the material for the thin-film yokes, such a problem can be solved. However, in order to obtain good soft magnetic characteristics (such as high magnetic permeability and low magnetic coercive force), a crystalline or microcrystalline soft magnetic film generally requires heat treatment at high temperature. Accordingly, in the case where the GMR film and the thin-film yokes are formed in this order, the heat treatment for improving the soft magnetic characteristics of the thin-film yokes breaks the GMR film to cause a problem of failing to obtain a normal sensor. For example, when the GMR film is composed of a nano-granular material, the electrical resistivity $\rho$ is significantly increased by the heat treatment at high temperature and the MR ratio is significantly decreased.

A problem that the invention is to solve is to provide a thin-film magnetic sensor having good electric and magnetic contact between a GMR film and thin-film yokes, and a method for manufacturing the same.

Further, another problem that the invention is to solve is to provide a thin-film magnetic sensor having a small increase in hysteresis even when it is exposed to high temperature during production or use, and a method for manufacturing the same.

Furthermore, still another problem that the invention is to solve is to provide a thin-film magnetic sensor having a small decrease in sensitivity and a small increase in hysteresis even when a GMR film is composed of a nano-granular material, and a method for manufacturing the same.

Namely, the present invention provides the following.

1. A thin-film magnetic sensor comprising:
a giant magnetoresistive film having a giant magnetoresistive effect, and thin-film yokes each comprising a soft magnetic material and electrically connected to both ends of the giant magnetoresistive film,
wherein each of the thin-film yokes comprises an outer yoke which comprises a first soft magnetic material and is provided outward with respect to the giant magnetoresistive film and an inner yoke which comprises a second soft magnetic material and is provided between the giant magnetoresistive film and the outer yoke;
wherein the first soft magnetic material comprises a crystalline or microcrystalline soft magnetic material;
wherein the thin-film magnetic sensor is obtained by (1) forming the each outer yoke, the giant magnetoresistive film and the each inner yoke in this order, and (2) performing a heat treatment for improving soft magnetic characteristics of the each outer yoke before forming the giant magnetoresistive film; and
wherein a length $L_2$ of the each inner yoke satisfies the following equation (a) and equation (b):

$$L_2/t_1 \geq 1 \tag{a}$$

$$L_2 \times 100/(L_1+L_2) \leq 50 \tag{b}$$

wherein $t_1$ is a thickness of the each outer yoke, and $L_1$ is a length of the each outer yoke.

2. The thin-film magnetic sensor according to item 1, wherein the length $L_2$ of the each inner yoke further satisfies the following equation (b'):

$$L_2 \times 100/(L_1+L_2) \leq 20 \tag{b'}$$

3. The thin-film magnetic sensor according to item 1 or 2, wherein the first soft magnetic material comprises at least one selected from the group consisting of:
(A) 40-90% Ni—Fe alloy, $Fe_{74}Si_9Al_{17}$, $Fe_{12}Ni_{82}Nb_6$, $Fe_{75.6}Si_{13.2}B_{8.5}Nb_{1.9}Cu_{0.8}$, $Fe_{83}Hf_6C_{11}$, $Fe_{85}Zr_{10}B_5$ alloy, $Fe_{93}Si_3N_4$ alloy and $Fe_{71}B_{11}N_{18}$ alloy;
(B) 40-90% Ni—Fe alloy/$SiO_2$ multilayer film;
(C) $Fe_{71.3}Nd_{9.6}O_{19.1}$ nano-granular alloy, $Co_{70}Al_{10}O_{20}$ nano-granular alloy and $Co_{65}Fe_5Al_{10}O_{20}$ nano-granular alloy; and
(D) $Co_{35}Fe_{35}Mg_{10}F_{20}$ nano-granular alloy.

4. The thin-film magnetic sensor according to any one of items 1 to 3, wherein the second soft magnetic material comprises an amorphous soft magnetic material.

5. A method for manufacturing a thin-film magnetic sensor which includes a giant magnetoresistive film having a giant magnetoresistive effect and thin-film yokes each comprising a soft magnetic material and electrically connected to both ends of the giant magnetoresistive film, the method comprising:
(1) forming a pair of outer yokes each comprising a first soft magnetic material on a surface of a substrate in such a manner that a length $L_2$ of each of inner yokes satisfies relations of equation (a) and equation (b):

$$L_2/t_1 \geq 1 \tag{a}$$

$$L_2 \times 100/(L_1+L_2) \leq 50 \tag{b}$$

wherein $t_1$ is a thickness of the each outer yoke, and $L_1$ is a length of the each outer yoke, and
the first soft magnetic material comprising a crystalline or microcrystalline soft magnetic material;
(2) heating the outer yokes to improve soft magnetic characteristics of the outer yokes;
(3) forming the giant magnetoresistive film between the pair of outer yokes; and
(4) forming the inner yokes each comprising a second soft magnetic material between the each outer yoke and the giant magnetoresistive film.

6. The method for manufacturing a thin-film magnetic sensor according to item 5, wherein the length $L_2$ of the each inner yoke further satisfies the following equation (b'):

$$L_2 \times 100/(L_1+L_2) \leq 20 \tag{b'}$$

When each thin-film yoke is divided into two parts, the outer yoke and the inner yoke, along a magnetic sensitive direction, and the outer yoke(s), the GMR film and the inner yoke(s) are formed in this order, good electric and magnetic contact is obtained between the GMR film and the each thin-film yoke.

Further, when the crystalline or microcrystalline soft magnetic material (first soft magnetic material) is used as the material for the outer yokes, and the outer yokes are heat treated after formation of the outer yokes and before formation of the GMR film, the soft magnetic characteristics of the thin-film yokes can be enhanced without breaking the GMR film. Furthermore, even when the magnetic sensor is exposed to high temperature during production or use, an increase in hysteresis does not occur.

DESCRIPTION OF REFERENCE NUMERALS AND SIGNS

10: Thin-film magnetic sensor
12: GMR film
14a, 14b: Thin-film yokes
16a, 16b: Outer yokes
18a, 18b: Inner yokes

BEST MODE FOR CARRYING OUT THE INVENTION

Figure 1:
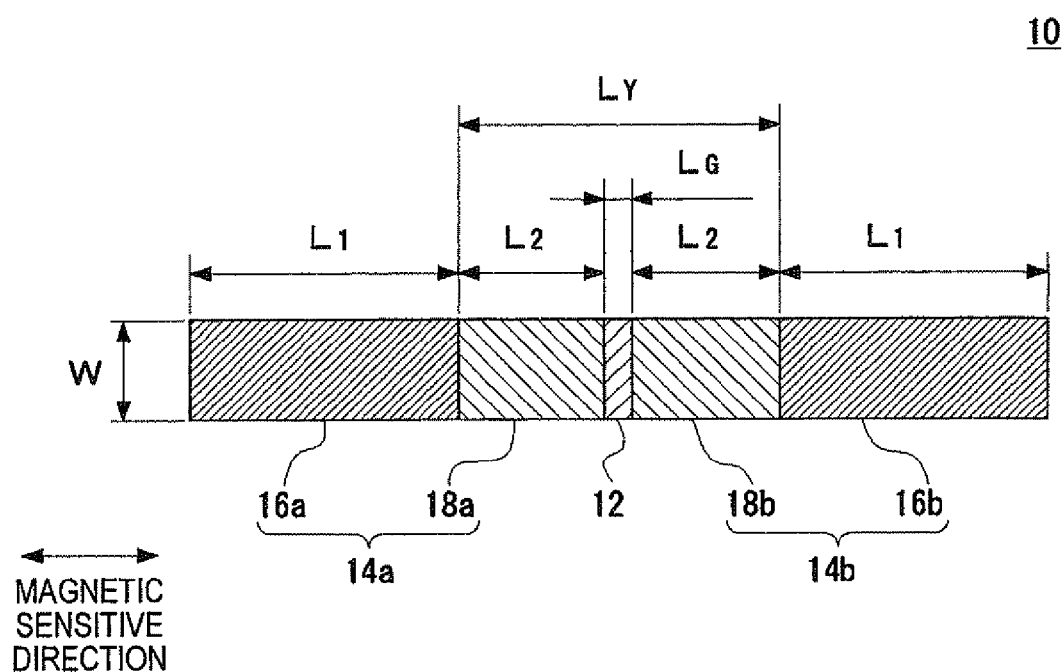
FIG. 1 is a plane view showing a thin-film magnetic sensor according to one embodiment of the invention.

One embodiment of the invention will be described in detail below.
1. Thin-Film Magnetic Sensor A plane view of the thin-film magnetic sensor according to the invention is shown in FIG. 1. Referring to FIG. 1, the thin-film magnetic sensor 10 comprises a GMR film 12 having a giant magnetoresistive effect and thin-film yokes 14a and 14b composed of a soft magnetic material and electrically connected to both ends of the GMR film 12. In this regard, although not particularly limited, the thickness of the thin-film magnetic sensor according to the invention is normally 100 μm or less, preferably 10 μm or less, and more preferably 2 μm or less.
1.1. GMR Film
1.1.1. Material The GMR film 12 is used for sensing a change in an external magnetic field as a change in electric resistance R and, as a result, detecting it as a change in voltage, and is composed of a material having the giant magnetoresistivite (GMR) effect. In order to detect the change in the external magnetic field at high sensitivity, the larger absolute value of the MR ratio of the GMR film is preferred. Specifically, the absolute value of the MR ratio of the GMR film 12 is preferably 5% or more, and more preferably 10% or more.

Further, the GMR film 12 is electrically connected directly to the thin-film yokes 14a and 14b, so that a GMR film having a higher electrical resistivity ρ than that of the thin-film yokes 14a and 14b is used as the GMR film 12. In General, when the electrical resistivity ρ of the GMR film 12 is excessively low, it is unfavorable because an electric short circuit occurs between the thin-film yokes 14a and 14b. On the other hand, when the electrical resistivity ρ of the GMR film 12 is excessively high, noises increase and it becomes difficult to detect the change in the external magnetic field as the change in voltage. Specifically, the electrical resistivity ρ of the GMR film 12 is preferably from $10^3$ μΩcm to $10^{12}$ μΩcm, and more preferably from $10^4$ μΩcm to $10^{11}$ μΩcm.

Although materials satisfying such conditions include various materials, the metal-insulator-based nano-granular material described above is particularly suitable among them. Not only the metal-insulator-based nano-granular material has high MR ratio and high electrical resistivity ρ, but also the MR ratio thereof does not largely fluctuate by slight compositional fluctuations. Accordingly, it has an advantage that a thin film having stable magnetic characteristics can be manufactured with good reproducibility and at low cost.

Specifically, the metal-insulator-based nano-granular materials used for the GMR film 12 include:

(1) oxide-based nano-granular alloy such as Co—$Y_2O_3$-based nano-granular alloy, Co—$Al_2O_3$-based nano-granular alloy, Co—$Sm_2O_3$-based nano-granular alloy, Ca—$Dy_2O_3$-based nano-granular alloy and FeCo—$Y_2O_3$-based nano-granular alloy; and (2) fluoride-based nano-granular alloy such as Fe—$MgF_2$, FeCo—$MgF_2$, Fe—$CaF_2$ and FeCo—$AlF_3$.
1.1.2. Shape and Size The shape and the size of the GMR film 12 are not particularly limited, and are determined so that the desired magnetic field sensitivity is obtained. Generally, the resistance value is in proportion with the length of a resistance element and in inverse proportion with the sectional area thereof. Accordingly, the electric resistance R of the GMR film 12 can be increased by increasing the length $L_G$ thereof, decreasing the thickness (the length in a direction perpendicular to the paper surface in FIG. 1) thereof, or narrowing the lateral width W. By increasing the electric resistance R, power consumption of a device can be reduced. However, when the electric resistance R of the GMR film 12 is excessively high, an impedance failure may occur with respect to an amplifier in some cases.
1.2. Thin-Film Yokes
1.2.1. Configuration The thin-film yokes 14a and 14b are faced to each other through a gap, and the GMR film 12 is electrically connected to the thin-film yokes in the gap or at the vicinity thereof.

The term "the vicinity of the gap" as used herein means a region influenced by an effect of a large amplified magnetic field generated at leading ends of the thin-film yokes 14a and 14b. The magnetic field generated between the thin-film yokes 14a and 14b becomes largest in the gap, so that it is most preferred to form the GMR film 12 in the gap. However, this means that when the magnetic field acting on the GMR film 12 is practically sufficiently large, the GMR film may also be entirely or partially out of the gap (for example, on the upper surface side or the lower surface side of the thin-film yokes 14a and 14b).

In the example shown in FIG. 1, the thin-film yokes 14a includes an outer yoke 16a, which is provided outward (on the outside) with respect to the GMR film 12 and comprises a first soft magnetic material, and an inner yoke 18a, which is provided between the GMR film 12 and the outer yoke 16a and comprises a second soft magnetic material. In addition, the thin-film yokes 14b includes an outer yoke 16b, which is provided outward (on the outside) with respect to the GMR film 12 and comprises a first soft magnetic material, and an inner yoke 18b, which is provided between the GMR film 12 and the outer yoke 16b and comprises a second soft magnetic material. That is to say, the thin-film yokes 14a and 14b are each divided into two parts along a magnetic sensitive direction. The thin-film magnetic sensor of the invention is different from conventional ones in this point.

Incidentally, the term "magnetic sensitive direction" means a direction of applying the external magnetic field at the time when the magnetic field sensitivity of the GMR film 12 is maximized.

1.2.2. Material

The thin-film yokes 14a and 14b are used for improving the magnetic field sensitivity of the GMR film 12 and comprises a soft magnetic material. In order to obtain high magnetic field sensitivity to a weak magnetic field, it is preferred to use a material having high magnetic permeability μ and/or high saturation magnetization Ms for the thin-film yokes 14a and 14b. Specifically, the magnetic permeability μ thereof is preferably 100 or more, and more preferably 1,000 or more. Further, the saturation magnetization Ms is preferably 5 (k Gauss) or more, and more preferably 10 (k Gauss) or more.

In the invention, the thin-film yokes 14a and 14b are each divided in two parts along the magnetic sensitive direction, so that the material for them is required to satisfy the following conditions, in addition to the above-mentioned conditions.

1.2.2.1. Material for Outer Yokes

The first soft magnetic material which constitutes the outer yokes 16a and 16b includes a crystalline or microcrystalline soft magnetic material. When using the crystalline or microcrystalline soft magnetic material, good soft magnetic characteristics are generally not obtained immediately after film formation (for example, the magnetic permeability is low, and the magnetic coercive force is high). In order to improve the soft magnetic characteristics, it is necessary to perform heat treatment after film formation. On the other hand, when the GMR film 12 is heated at a certain critical temperature or more, the MR characteristics of the GMR film 12 are deteriorated. The heat treatment temperature for improving the magnetic characteristics of the crystalline or microcrystalline soft magnetic material is generally higher than the critical temperature at which the characteristics of the GMR film 12 start to be deteriorated.

Accordingly, the thin-film magnetic sensor 10 according to the invention is obtained by (1) forming the outer yokes 16a and 16b, the GMR film 12 and the inner yokes 18a and 18b in this order, and (2) performing the heat treatment for improving the soft magnetic characteristics of the outer yokes 16a and 16b, before the formation of the GMR film 12, as will be described later.

Preferred specific examples of the first soft magnetic materials include:

(A) 40-90% Ni—Fe alloy, $Fe_{74}Si_9Al_{17}$, $Fe_{12}Ni_{82}Nb_6$, $Fe_{75.6}Si_{13.2}B_{8.5}Nb_{1.9}Cu_{0.8}$, $Fe_{83}Hf_6C_{11}$, $Fe_{85}Zr_{10}B_5$ alloy, $Fe_{93}Si_3N_4$ alloy and $Fe_{71}B_{11}N_{18}$ alloy;

(B) 40-90% Ni—Fe alloy/$SiO_2$ multilayer film;

(C) $Fe_{71.3}Nd_{9.6}O_{19.1}$ nano-granular alloy, $Co_{70}Al_{10}O_{20}$ nano-granular alloy and $Co_{65}Fe_5Al_{10}O_{20}$ nano-granular alloy; and (D) $Co_{35}Fe_{35}Mg_{10}Fe_{20}$ nano-granular alloy.

The outer yokes 16a and 16b may include either any one of these materials or two or more thereof.

1.2.2.2. Material for Inner Yokes

The second soft magnetic material which constitutes the inner yokes 18a and 18b is not particularly limited, and may be either a crystalline or microcrystalline soft magnetic material or an amorphous soft magnetic material.

Preferred specific examples of the second soft magnetic materials include:

(A) 40-90% Ni—Fe alloy, $Fe_{74}Si_9Al_{17}$, $Fe_{12}Ni_{82}Nb_6$, $Fe_{75.6}Si_{13.2}B_{8.5}Nb_{1.9}Cu_{0.8}$, $Fe_{83}Hf_6C_{11}$, $Fe_{85}Zr_{10}B_5$ alloy, $Fe_{93}Si_3N_4$ alloy and $Fe_{71}B_{11}N_{18}$ alloy;

(B) 40-90% Ni—Fe alloy/$SiO_2$ multilayer film;

(C) $Fe_{71.3}Nd_{9.6}O_{19.1}$ nano-granular alloy, $Co_{70}Al_{10}O_{20}$ nano-granular alloy and $Co_{65}Fe_5Al_{10}O_{20}$ nano-granular alloy;

(D) $Co_{35}Fe_{35}Mg_{10}F_{20}$ nano-granular alloy; and (E) $(Co_{94}Fe_6)_{70}Si_{15}B_{15}$ amorphous alloy and $Co_{88}Nb_6Zr_6$ amorphous alloy.

The inner yokes 18a and 18b may include either any one of these materials or two or more thereof.

Among these materials, the amorphous soft magnetic materials such as $(Co_{94}Fe_6)_{70}Si_{15}B_{15}$ or $Co_{88}Nb_6Zr_6$ are suitable as the material for constituting the inner yokes 18a and 18b, because high characteristics can be obtained merely by forming the film at room temperature.

1.2.3. Shape and Size

It is necessary that the length $L_2$ of each of the inner yokes 18a and 18b satisfies the following equation (a) and equation (b):

$$L_2/t_1 \geq 1 \tag{a}$$

$$L_2 \times 100/(L_1+L_2) \leq 50 \tag{b}$$

in which $t_1$ is the thickness of each of the outer yokes 16a and 16b, and $L_1$ is the length of each of the outer yokes 16a and 16b.

In this regard, $t_1$ indicates the length of each of the outer yokes in a direction perpendicular to the paper surface in FIG. 1.

In addition, when the thin-film yokes 14a and 14b are not bilaterally symmetrical, it is sufficient that the length $L_2$ of the inner yoke 18a, the thickness $t_1$ of the outer yoke 16a and the length $L_1$ of the outer yoke 16a satisfy the above-mentioned equations (a) and (b), and also the length $L_2$ of the inner yoke 18b, the thickness $t_1$ of the outer yoke 16b and the length $L_1$ of the outer yoke 16b satisfy the above-mentioned equations (a) and (b).

When $L_2$ is excessively short, it becomes difficult to form good inner yokes 18a and 18b between each outer yoke 16a and 16b and the GMR film 12. Accordingly, the ratio of $L_2/t_1$ is required to be 1 or more. The ratio of $L_2/t_1$ is more preferably 3 or more, and still more preferably 5 or more.

On the other hand, when $L_2$ is excessively long, the tendency of the characteristics of the whole thin-film yokes 14a and 14b to be governed by the characteristics of the inner yokes 18a and 18b becomes strong. For that reason, there is a fear that the soft magnetic characteristics of the whole thin-film yokes 14a and 14b decrease, or hysteresis increases during production or use. Accordingly, the ratio of the length of each of the inner yokes 18a and 18b to the total length of each of the thin-film yokes 14a and 14b ($=L_2 \times 100/(L_1-L_2)$) is required to be 50% or less. The ratio of the length of each of the inner yokes 18a and 18b is more preferably 40% or less, and still more preferably 30% or less.

In particular, it is preferred that the length $L_2$ of each of the inner yokes 18a and 18b satisfies the following equation (b'):

$$L_2 \times 100/(L+L_2) \leq 20 \tag{b'}$$

When the length $L_2$ satisfies equation (b'), the characteristics of the whole thin-film yokes 14a and 14b are approximately governed by the characteristics of the outer yokes 16a and 16b. Accordingly, when the above-mentioned material is used as the first soft magnetic material and proper heat treatment is performed to the outer yokes 16a and 16b, the soft magnetic characteristics of the whole thin-film yokes 14a and 14b is improved without depending on the material of the inner yokes 18a and 18b. Moreover, there is no possibility of an increase in hysteresis during production or use.

In this regard, when the thin-film yokes 14a and 14b are not bilaterally symmetrical, it is sufficient that the length $L_2$ of the inner yoke 18a and the length $L_1$ of the outer yoke 16a satisfy the above-mentioned equation (b'), and also the length $L_2$ of the inner yoke 18b and the length $L_1$ of the outer yoke 16b satisfy the above-mentioned equations (b').

The width W of each of the thin-film yokes 14a and 14b is not particularly limited, and an optimum value can be selected depending on the purpose. Further, in the example shown in FIG. 1, the thin-film yokes 14a and 14b are drawn in a rectangular shape having a constant width. However, this is for an illustrative purpose only, and the shape should not be construed as being limited thereto.

For example, the width W of each of the thin-film yokes 14a and 14b may be decreased continuously or stepwise from the both ends to the GMR film 12. When the width W of each of the thin-film yokes 14a and 14b is decreased continuously or stepwise, more magnetic fluxes can be collected to the GMR film 12. Accordingly, there is an advantage that magnetic field sensitivity is improved.

The thickness of each of the thin-film yokes 14a and 14b (that is to say, the thickness $t_1$ of each of the outer yokes 16a and 16b and the thickness $t_2$ of each of the inner yokes 18a and 18b) is also not particularly limited, and an optimum value can be selected depending on the purpose.

Further, the shapes of the thin-film yokes 14a and 14b are preferably bilaterally symmetrical, but may be bilaterally asymmetrical, as long as the above-mentioned conditions are satisfied.

2. Manufacturing Method of Thin-film Magnetic Sensor

Figure 2:
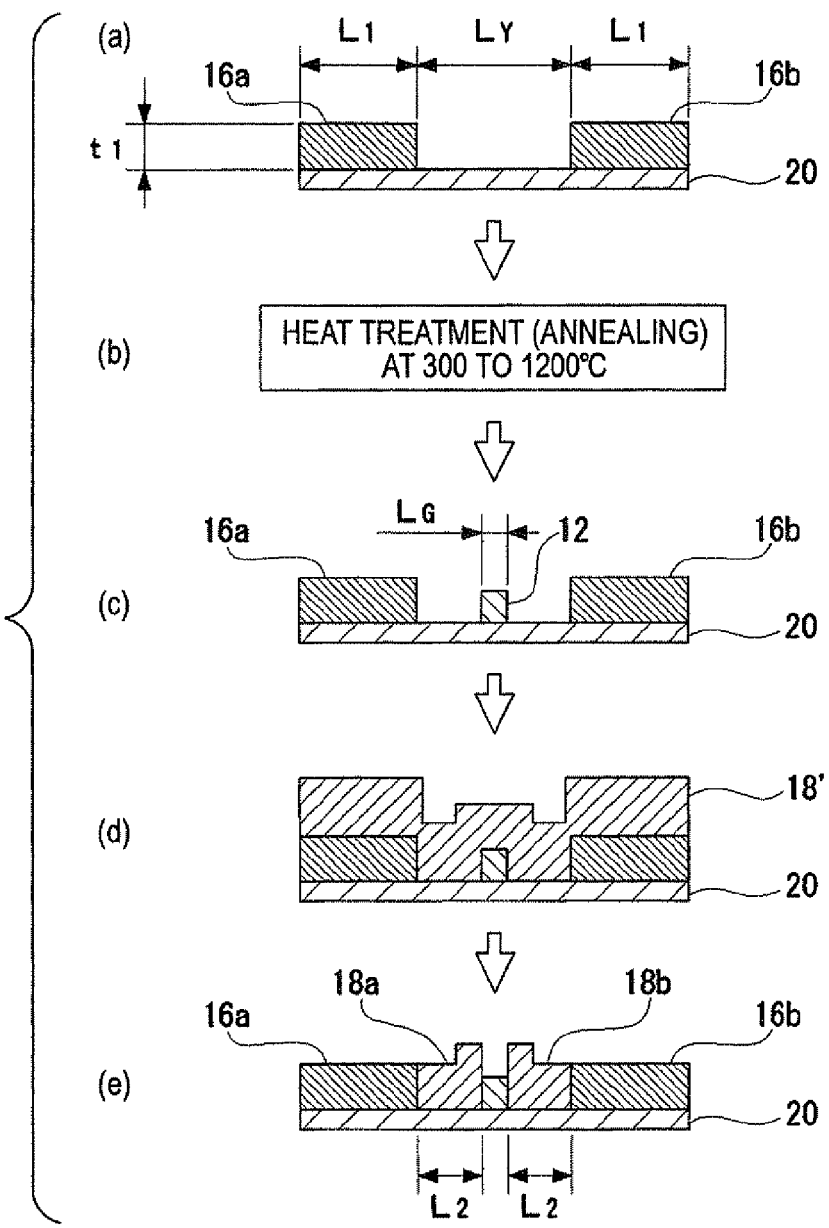
FIG. 2 is a flow sheet showing a manufacturing method of a thin-film magnetic sensor according to the invention.

A flow sheet of the manufacturing method of a thin-film magnetic sensor according to the invention is shown in FIG. 2. Referring to FIG. 2, the manufacturing method of a thin-film magnetic sensor includes an outer yoke forming step, a heat treatment step, a GMR film forming step and an inner yoke forming step.

2.1. Outer Yoke Forming Step

The outer yoke forming step is a step of forming a pair of outer yokes 16a and 16b each comprising the first soft magnetic material on a surface of a substrate 20 in such a manner that the length $L_2$ of each of inner yokes 18a and 18b satisfies relations of equation (a) and equation (b) (see, (a) in FIG. 2):

$$L_2/t_1 \geq 1 \quad (a)$$

$$L_2 \times 100/(L_1+L_2) \leq 50 \quad (b)$$

wherein $t_1$ is the thickness of each of the outer yokes 16a and 16b, and $L_1$ is the length of each of the outer yokes 16a and 16b.

When the thin-film yokes 14a and 14b are bilaterally symmetrical, the pair of outer yokes 16a and 16b composed of the first soft magnetic material are formed in such a manner that the distance $L_Y$ between the outer yokes 16a and 16b satisfies a relation of equation (c):

$$2t_1+L_G \leq L_Y \leq 2L_1+L_G \quad (c)$$

wherein $t_1$ is the thickness of each of the outer yokes 16a and 16b, $L_1$ is the length of each of the outer yokes 16a and 16b, and $L_G$ is the length of a GMR film formed between the pair of outer yokes 16a and 16b.

When the thin-film yokes 14a and 14b are bilaterally symmetrical, a relation of the following equation (d) holds among $L_Y$, $L_2$ and $L_G$. Equation (c) is obtained from equation (a), equation (b) and equation (d):

$$L_Y=2L_2+L_G \quad (d)$$

Further, it is preferred that the length $L_2$ of each of the inner yokes 18a and 18b further satisfies the following equation (b'):

$$L_2 \times 100/(L_1+L_2) \leq 20 \quad (b')$$

When the thin-film yokes 14a and 14b are bilaterally symmetrical, the distance $L_Y$ between the outer yokes 16a and 16b preferably satisfies equation (c'). Equation (c') is obtained from equation (a), equation (b') and equation (d).

$$2t_1+L_G \leq L_Y \leq 2(L_1/4)+L_G \quad (c')$$

It is sufficient that the substrate 20 has at least a surface composed of a non-magnetic insulating material.

Materials for the substrate 20 specifically include:

(a) glass, alumina, MgO, quartz and sapphire;

(b) silicon on a surface of which a $SiO_2$ film is formed and alumina-titanium carbide on a surface of which an alumina film is formed; and (c) a non-magnetic metal material on a surface of which a thin film composed of a non-magnetic insulating material is formed.

A forming method of the outer yokes 16a and 16b is not particularly limited, and various thin-film forming methods can be used. Details of the first soft magnetic material are as described above, so that the description thereof is omitted.

2.2. Heat Treatment Step (Annealing Step)

The heat treatment step (annealing step) is a step of heating the outer yokes 16a and 16b to improve the soft magnetic characteristics of the outer yokes 16a and 16b (see, (b) in FIG. 2).

As the heat treatment temperature of the outer yokes 16a and 16b, an optimum temperature is selected depending on the kind of first soft magnetic material. The heat treatment temperature is usually from 300° C. to 1,200° C.

For example, in the case where the GMR film 12 comprises a nano-granular material, on heating the GMR film 12 within this temperature range, the electrical resistivity $\rho$ increases and the MR ratio decreases. The reason for this is considered to be that nano-granular particles are coarsened to increase the thickness of an insulating film at a particle interface. Also for the GMR film comprising a material other than the nano-granular material (for example, a multilayer film), the characteristics of the GMR film are deteriorated by interlayer atomic diffusion when heated to a certain critical temperature or more.

2.3. GMR Film Forming Step

The GMR film forming step is a step of forming the GMR film 12 between the pair of outer yokes 16a and 16b (see, (c) in FIG. 2).

A forming method of the GMR film 12 is not particularly limited, and various thin-film forming methods can be used. Details of the GMR film 12 a re as described above, so that the description thereof is omitted.

2.4. Inner Yoke Forming Step

The inner yoke forming step is a step of forming the inner yokes 18a and 18b, respectively, each of which comprises the second soft magnetic material, between each of the pair of outer yokes 16a and 16b and the GMR film 12.

A forming method of the inner yokes 18a and 18b is not particularly limited, and various thin-film forming methods can be used.

In the example shown in FIG. 2, the inner yokes 18a and 18b are formed by (a) forming a thin film 18' comprising the second soft magnetic material on the entire surface of the substrate 20 (see, (d) in FIG. 2), and (b) removing an unnecessary portion of the thin film 18' by etching (see, (e) in FIG. 2).

Details of the second soft magnetic material are as described above, so that the description thereof is omitted.

3. Operations of Thin-film magnetic sensor and Manufacturing Method Thereof

In the magnetic sensor in which the thin-film yokes are disposed on both ends of the GMR film, the sensitivity thereof is mainly determined by the shape and magnetic characteristics of the thin-film yokes. Conventionally, amorphous soft magnetic materials have been used for the thin-film yokes. This is because the amorphous soft magnetic materials can provide the desired performance merely by performing film formation without necessity of the heat treatment for improving the soft magnetic characteristics.

Figure 3:
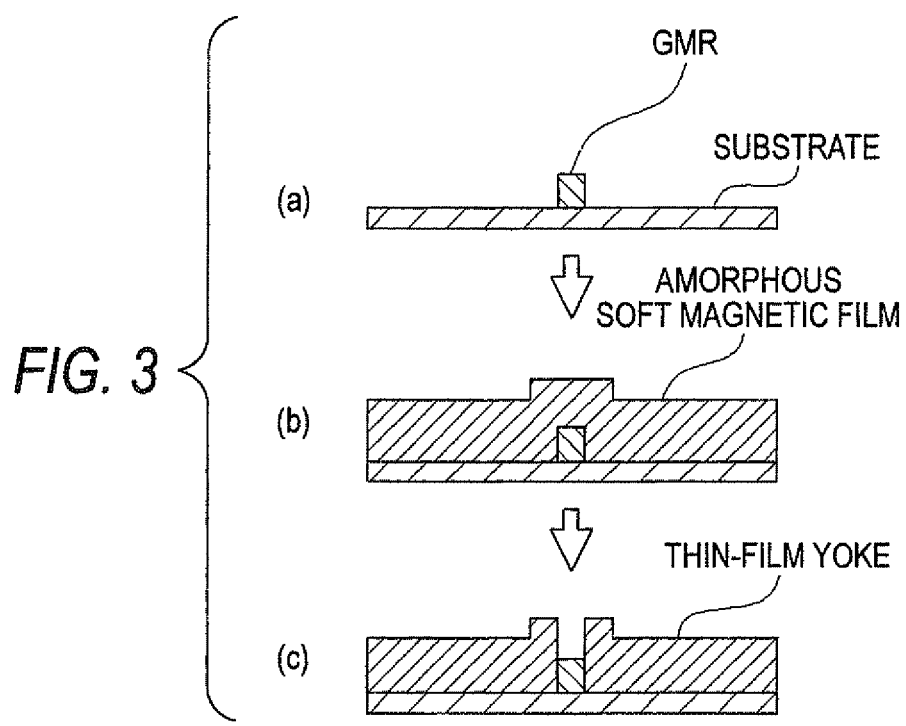
FIG. 3 is a flow sheet showing a conventional manufacturing method of a thin-film magnetic sensor.

The conventional thin-film magnetic sensor in which the amorphous soft magnetic material is used for the thin-film yokes has been manufactured by (a) forming the GMR film on a surface of a substrate (see, (a) in FIG. 3), (b) forming an amorphous soft magnetic film on the entire surface of the substrate (see (b) in FIG. 3), and removing an unnecessary portion of the amorphous soft magnetic film by etching to form the thin-film yokes (see, (c) in FIG. 3), as shown in FIG. 3. By this method, good electric and magnetic contact between the GMR film and the thin-film yokes can be easily obtained. Accordingly, the thin-film magnetic sensor can be well manufactured without variation.

The yoke material of the thin-film magnetic sensor is required to have high saturation magnetization and magnetic permeability as well as low magnetic coercive force. In particular, the magnetic coercive force is an important factor which has an influence on hysteresis as one of the sensor characteristics. In the case where the hysteresis is unnegligibly large with respect to detection sensitivity, a functional problem arises that a change in a direction of an external magnetic field causes a failure to correctly detect the intensity of the magnetic field.

Figure 4A:
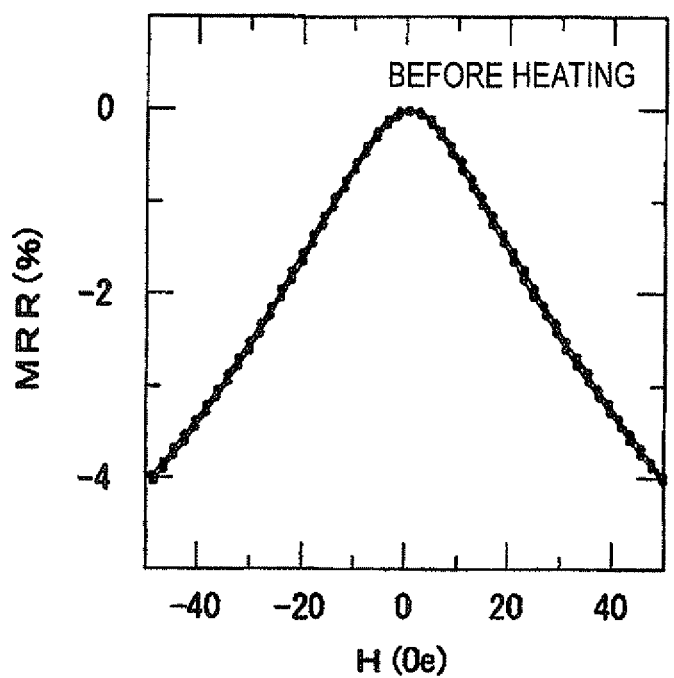
FIGS. 4A and 4B are graphs showing one example of MR characteristics of a conventional thin-film magnetic sensor having thin-film yokes composed of an amorphous material, before heating at high temperature (FIG. 4A) and after heating (FIG. 4B).
Figure 4B:
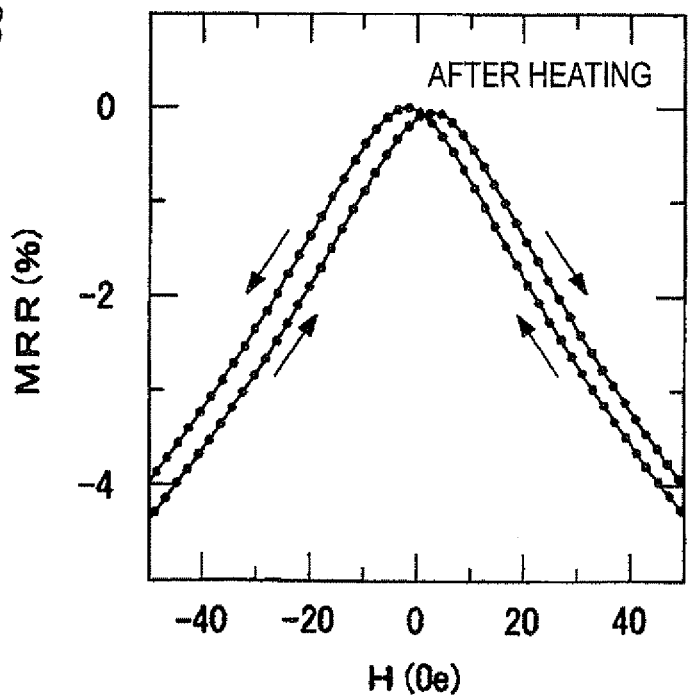

The amorphous soft magnetic material shows excellent soft magnetic characteristics, and the magnetic coercive force thereof is also low. Accordingly, the hysteresis is also small immediately after film formation (before heating) as shown in FIG. 4A.

However, an amorphous structure is a metastable structure and not a stable structure such as a crystal structure, so that it is unstable to heat. Accordingly, there is a problem that crystallization proceeds on exposure to a certain degree of high temperature, resulting in a failure to obtain the predetermined characteristics. In particular, the magnetic coercive force is extremely increased by exposure to high temperature.

When the magnetic sensor is actually used, it is exposed to high temperature (usually, about 250° C.) by solder reflow and the like at the time of mounting, or used at a temperature of about 100° C. for a long period of time, in some cases. Under such situations, crystallization of the amorphous structure proceeds, thereby increasing the hysteresis.

This phenomenon becomes apparent particularly in an amorphous material. Accordingly, the above-mentioned problem may be expected to be solved by using a crystalline or microcrystalline material as the soft magnetic material.

However, when a crystalline or microcrystalline soft magnetic film is formed by a dry film forming method such as sputtering, the soft magnetic film immediately after film formation has poor soft magnetic characteristics (the magnetic permeability is low, and the magnetic coercive force is high). In order to obtain good soft magnetic characteristics, it becomes necessary to perform the heat treatment at high temperature after film formation. The heat treatment temperature at this time is generally higher than the critical temperature at which the characteristics of the GMR film starts to deteriorate. Accordingly, in the case where the GMR film and the thin-film yokes are formed in this order, when the sensor is subjected to the heat treatment in order to improve the soft magnetic characteristics of the thin-film yokes, the GMR film breaks, thus resulting in a failure to manufacture the normal sensor.

Compared with this, when the thin-film yokes are each divided into two parts along a magnetic sensitive direction, and the outer yokes comprising the crystalline or microcrystalline material are formed at the start of the manufacturing process, followed by heat treatment at a predetermined temperature, the outer yokes having good soft magnetic characteristics are obtained. Subsequently, when the GMR film and the inner yokes are formed in this order, good electric and magnetic contact is obtained between the GMR film and each of the thin-film yokes without breaking the GMR film. Moreover, when the length $L_2$ of each of the inner yokes is set within a specific range, the magnetic characteristics of the whole thin-film yokes are governed by the outer yokes. Accordingly, when the inner yokes are exposed to high temperature during production or use and the magnetic characteristics of these portions are deteriorated, an influence on the performance of the whole yokes is negligible. Further, this makes it possible to normally operate as a sensor even after exposed to high temperature.

EXAMPLES

Example 1

1. Preparation of Samples

A thin-film magnetic sensor 10 shown in FIG. 1 was prepared according to a procedure shown in FIG. 2. A silicon having a thermally-oxidized silicon ($SiO_2$) film formed thereon was used as a substrate 20, and $Ni_{80}Fe_{20}$ was used for outer yokes 16a and 16b. Further, $FeCo$—$MgF_2$ nano-granular alloy was used for a GMR film 12, and an amorphous alloy, $(Co_{94}Fe_6)_{70}Si_{15}B_{15}$, was used for inner yokes 18a and 18b.

$L_1$ and $L_2$ were changed within the range of 0 to 270 μm and the range of 10 to 300 μm, respectively. W was set to 20 μm or 100 μm. Further, both the thickness $t_1$ of the outer yokes 16a and 16b and the thickness $t_2$ of the inner yokes 18a and 18b were set to 1 μm, respectively.

2. Test Method

Figure 5:
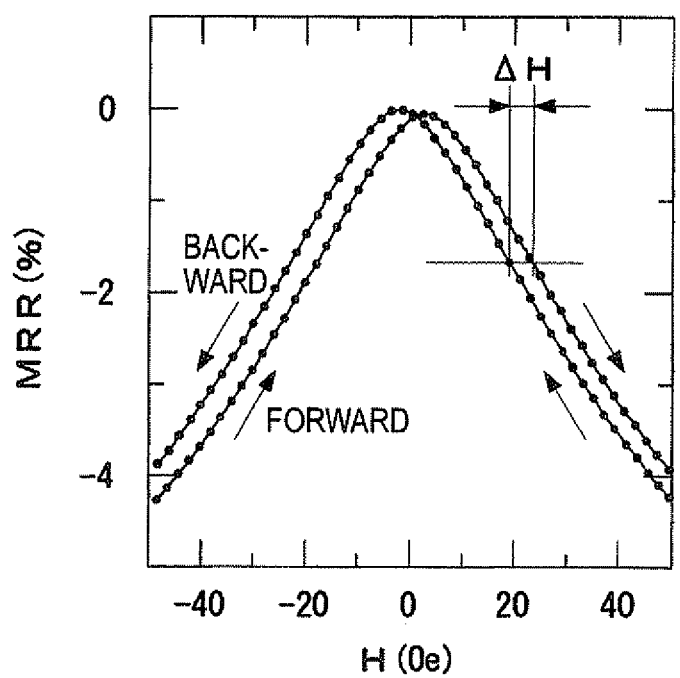
FIG. 5 is a conceptual diagram for illustrating a definition of the amount of hysteresis $\Delta H_{max}$.

For the thin-film magnetic sensors obtained, the MR characteristics were evaluated before and after heating at 200° C. for 60 minutes, respectively. From a MR waveform measured, the hysteresis amount was determined. As shown in FIG. 5, the difference ΔH in magnetic field H between "forward" and "backward" at the same MR ratio was sequentially determined. The maximum value ΔHmax thereof was defined as the hysteresis amount.

3. Results

The results thereof are shown in Table 1. Incidentally, histories of the respective sensors are shown together in Table 1. The followings can be seen from Table 1.

(1) In the case of $L_1=0$, namely in the case where the whole thin-film yokes are composed of amorphous material, the hysteresis amount $\Delta Hmax$ before heating is small. However, the hysteresis amount $\Delta Hmax$ significantly increases by heating.

(2) When the length ratio of the inner yokes ($=L_2 \times 100/(L_1+L_2)$) is 50% or less, the difference in the hysteresis amount $\Delta Hmax$ between before and after heating decreases.

(3) When the length ratio of the inner yokes is 20% or less, the difference in the hysteresis amount $\Delta Hmax$ between before and after heating becomes approximately zero.

(4) Tendencies of the above (1) to (3) are observed independently of the width W of the yoke and the total length ($L_1+L_2$) of the yoke.

TABLE 1

| No. | W (μm) | $L_1+L_2$ (μm) | $L_1$ (μm) | $L_2$ (μm) | $\Delta Hmax$ (Oe) Before Heating | $\Delta Hmax$ (Oe) After Heating | Difference in $\Delta Hmax$ |
|---|---|---|---|---|---|---|---|
| 1 | 20 | 100 | 0 | 100 | 0.5 | 3.8 | +3.3 |
| 2 | 20 | 100 | 50 | 50 | 0.5 | 3.0 | +2.5 |
| 3 | 20 | 100 | 70 | 30 | 0.5 | 2.8 | +2.3 |
| 4 | 20 | 100 | 80 | 20 | 0.5 | 0.5 | 0.0 |
| 5 | 20 | 100 | 90 | 10 | 0.5 | 0.5 | 0.0 |
| 6 | 100 | 100 | 0 | 100 | 0.4 | 3.9 | +3.5 |
| 7 | 100 | 100 | 50 | 50 | 0.4 | 3.3 | +2.9 |
| 8 | 100 | 100 | 70 | 30 | 0.4 | 3.0 | +2.6 |
| 9 | 100 | 100 | 80 | 20 | 0.4 | 0.4 | 0.0 |
| 10 | 100 | 100 | 90 | 10 | 0.4 | 0.4 | 0.0 |
| 11 | 20 | 300 | 0 | 300 | 0.5 | 4.2 | 3.7 |
| 12 | 20 | 300 | 150 | 150 | 0.5 | 4.1 | 3.6 |
| 13 | 20 | 300 | 210 | 90 | 0.5 | 3.2 | 2.7 |
| 14 | 20 | 300 | 240 | 60 | 0.5 | 0.6 | 0.0 |
| 15 | 20 | 300 | 270 | 30 | 0.5 | 0.5 | 0.0 |

Example 2

1. Preparation of Samples

A thin-film magnetic sensor 10 shown in FIG. 1 was prepared according to a procedure shown in FIG. 2. Various materials described later were used for outer yokes 16a and 16b. Further, an amorphous alloy, $(Co_{94}Fe_6)_{70}Si_{15}B_{15}$, was used for inner yokes 18a and 18b. The same materials as in Example 1 were used for a substrate 20 and a GMR film 12.

Dimensions of respective parts were $L_1=80$ μm, $L_2=20$ μm, W=20 μm and $t_1=t_2=1$ μm.

2. Test Method

The hysteresis amount $\Delta Hmax$ between before and after heating at 200° C. for 60 minutes was determined according to the same procedure as in Example 1.

3. Results

The results thereof are shown in Table 2. Incidentally, the materials used for the outer yokes are shown together in Table 2. The following are known from Table 2.

(1) When the amorphous soft magnetic material is used as the material for the outer yokes (sample No. 21), the hysteresis amount $\Delta Hmax$ before heating is small. However, the hysteresis amount $\Delta Hmax$ significantly increases by heating.

(2) When the heat-treated crystalline or microcrystalline soft magnetic materials are used as the material for the outer yokes (sample Nos. 22 to 29), the difference in the hysteresis amount $\Delta Hmax$ between before and after heating becomes approximately zero, independently of the material for the inner yokes.

TABLE 2

| No. | Material for Outer Yokes | $\Delta Hmax$ (Oe) Before Heating | $\Delta Hmax$ (Oe) After Heating | Difference in $\Delta Hmax$ |
|---|---|---|---|---|
| 21 | Amorphous Alloy, $(Co_{94}Fe_6)_{70}Si_{15}B_{15}$ | 0.5 | 3.8 | +3.3 |
| 22 | $Ni_{80}Fe_{20}$ | 0.5 | 0.5 | 0.0 |
| 23 | Multilayer Film [$Ni_{80}Fe_{20}$ (0.24 μm)/$SiO_2$ (0.01 μm)], N = 4 | 0.1 | 0.1 | 0.0 |
| 24 | $Fe_{74}Si_9Al_{17}$ | 0.2 | 0.2 | 0.0 |
| 25 | $Fe_{12}Ni_{82}Nb_6$ | 0.1 | 0.1 | 0.0 |
| 26 | $Fe_{75.6}Si_{13.2}B_{8.5}Nb_{1.9}Cu_{0.8}$ | 0.2 | 0.2 | 0.0 |
| 27 | $Fe_{83}Hf_6C_{11}$ | 0.15 | 0.15 | 0.0 |
| 28 | $Co_{70}Al_{10}O_{20}$ | 0.4 | 0.4 | 0.0 |
| 29 | $Co_{35}Fe_{35}Mg_{10}F_{20}$ | 0.7 | 0.7 | 0.0 |

* $L_1 = 80$ μm, $L_2 = 20$ μm, W = 20 μm and $t_1 = t_2 = 1$ μm
Material for inner yokes: Amorphous alloy, $(Co_{94}Fe_6)_{70}Si_{15}B_{15}$ Although the invention has been described in detail below with reference to preferred embodiments thereof, it should be understood that the invention is not limited to the embodiments described above in any way, and various modifications can be made within the range not departing from the gist of the invention.

The thin-film magnetic sensor according to the invention can be used for detection of rotation information of automobile axles, rotary encoders, industrial gears and the like, detection of position-speed information of stroke positions of hydraulic cylinders/pneumatic cylinders, slides of machine-tools and the like, detection of current information of arc current of industrial welding robots and the like, geomagnetic azimuth compasses and the like.

Further, the magnetoresistive element having the GMR film and the thin-film yokes disposed on both ends thereof is particularly suitable as the magnetic sensor. However, the use of the magnetoresistive element is not limited thereto, and it can be used as a magnetic memory, a magnetic head or the like.

The present application is based on Japanese Patent Application No. 2010-011433 filed on Jan. 21, 2010, the contents thereof being incorporated herein by reference.

What is claimed is:

1. A method for manufacturing a thin-film magnetic sensor which includes a giant magnetoresistive film having a giant magnetoresistive effect and a pair of thin-film yokes each comprising a soft magnetic material and each electrically connected to a respective end of the giant magnetoresistive film, each of the thin-film yokes comprising an outer yoke and an inner yoke, the method comprising, in the following order:
    forming the pair of the outer yokes each comprising a first soft magnetic material on a surface of a substrate;
    (2) heating the pair of the outer yokes to improve soft magnetic characteristics of the pair of the outer yokes;
    (3) forming the giant magnetoresistive film between the pair of the outer yokes; and (4) forming the inner yokes, each comprising a second soft magnetic material, each respective inner yoke formed between a respective one of the outer yokes and the giant magnetoresistive film, wherein a length $L_2$ of each of the inner yokes formed between the pair of the outer yokes and the giant magnetoresistive film satisfies equation (a) and equation (b):

$$L_2/t_1 \geq 1 \tag{a}$$

$$L_2 \times 100/(L_1+L_2) \leq 50 \tag{b}$$

wherein $t_1$ is a thickness of the each outer yoke, and $L_1$ is a length of the each outer yoke, a line that is parallel to a longitudinal extension of the sensor passes through, in order, a first of the outer yokes, a first of the inner yokes, the giant magnetoresistive film, a second of the inner yokes, and a second of the outer yokes, and the first soft magnetic material comprising a crystalline or microcrystalline soft magnetic material.

2. The method for manufacturing a thin-film magnetic sensor according to claim 1, wherein the length $L_2$ of the each inner yoke further satisfies the following equation (b'):

$$L_2 \times 100/(L_1+L_2) \leq 20 \tag{b'}$$

* * * * *